United States Patent
Chen et al.

(10) Patent No.: US 10,818,615 B2
(45) Date of Patent: *Oct. 27, 2020

(54) SEMICONDUCTOR STRUCTURE

(71) Applicant: TAIWAN SEMICONDUCTOR MANUFACTURING COMPANY LTD., Hsinchu (TW)

(72) Inventors: Ying-Ju Chen, Yunlin County (TW); Hsien-Wei Chen, Hsinchu (TW); Ming-Fa Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,132

(22) Filed: Jun. 14, 2019

(65) Prior Publication Data

US 2019/0295964 A1    Sep. 26, 2019

Related U.S. Application Data

(63) Continuation of application No. 16/122,243, filed on Sep. 5, 2018, now Pat. No. 10,325,865, which is a
(Continued)

(51) Int. Cl.
*H01L 23/58* (2006.01)
*H01L 23/31* (2006.01)
(Continued)

(52) U.S. Cl.
CPC ........ *H01L 23/585* (2013.01); *H01L 21/4846* (2013.01); *H01L 23/3128* (2013.01);
(Continued)

(58) Field of Classification Search
CPC ............. H01L 23/585; H01L 23/49827; H01L 23/3128; H01L 24/02; H01L 21/4846
USPC ....... 257/737, 700, 529, 620, 621, 669, 691, 257/E23.002, E23.012, E23.023, E23.068, 257/E25.006, E25.017, E25.018, E25.027,
(Continued)

(56) References Cited

U.S. PATENT DOCUMENTS 9,659,879 B1 * 5/2017 Yang ................... H01L 23/3142
9,673,119 B2 * 6/2017 Lin ......................... H01L 23/10
(Continued)

FOREIGN PATENT DOCUMENTS

CN          106486442          3/2017

OTHER PUBLICATIONS

Office Action of the CN family application CN201711215193.2 dated Aug. 21, 2020.

*Primary Examiner* — Dao H Nguyen
(74) *Attorney, Agent, or Firm* — WPAT, P.C., Intellectual Property Attorneys; Anthony King

(57) ABSTRACT

A semiconductor structure includes a die, a molding surrounding the die, a first seal ring disposed over the molding, and a second seal ring disposed below the molding. The semiconductor structure further includes a first interconnect structure disposed below the first surface of the die and a second interconnect structure disposed over the second surface and the molding. The first seal ring is disposed in the second interconnect structure and disposed over the molding, and the second seal ring is provided within the die and the first interconnect structure.

20 Claims, 14 Drawing Sheets

Related U.S. Application Data continuation of application No. 15/676,309, filed on Aug. 14, 2017, now Pat. No. 10,074,618.

(51) Int. Cl.
 H01L 23/00 (2006.01)
 H01L 23/498 (2006.01)
 H01L 21/48 (2006.01)
 H01L 23/538 (2006.01)

(52) U.S. Cl.
 CPC ...... H01L 23/49827 (2013.01); H01L 23/562 (2013.01); H01L 24/02 (2013.01); *H01L 23/5389* (2013.01); *H01L 2224/02331* (2013.01); *H01L 2224/02371* (2013.01); *H01L 2224/02379* (2013.01); *H01L 2224/02381* (2013.01)

(58) Field of Classification Search
 USPC .. 257/E27.013, E21.499, E21.509, E21.584, 257/E21.585; 438/112, 113, 107, 127, 438/622, 627
 See application file for complete search history.

(56) References Cited

U.S. PATENT DOCUMENTS

| | | | |
|---|---|---|---|
| 10,074,618 B1* | 9/2018 | Chen | H01L 24/02 |
| 10,325,865 B2* | 6/2019 | Chen | H01L 24/96 |
| 2012/0205791 A1* | 8/2012 | Su | H01L 21/76898 |
| | | | 257/682 |
| 2012/0241981 A1* | 9/2012 | Hirano | H01L 23/522 |
| | | | 257/777 |
| 2015/0270229 A1* | 9/2015 | Kang | H01L 23/562 |
| | | | 257/508 |
| 2015/0348916 A1* | 12/2015 | Chen | H01L 21/4803 |
| | | | 257/669 |
| 2016/0020181 A1* | 1/2016 | Yu | H01L 23/585 |
| | | | 257/737 |

* cited by examiner

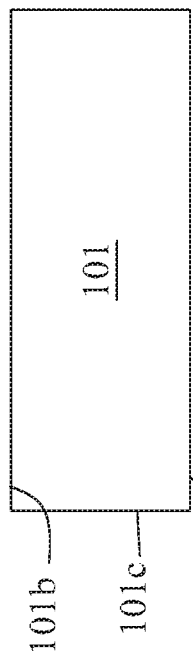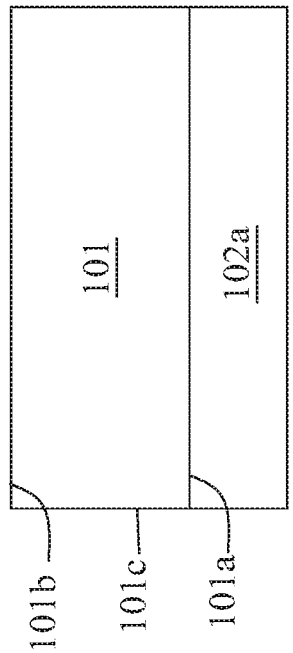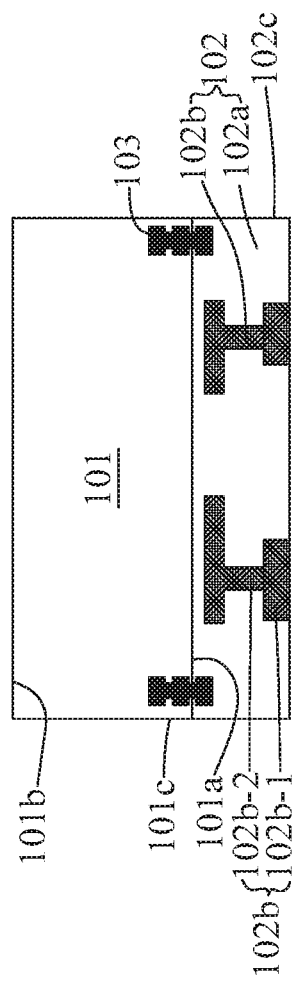

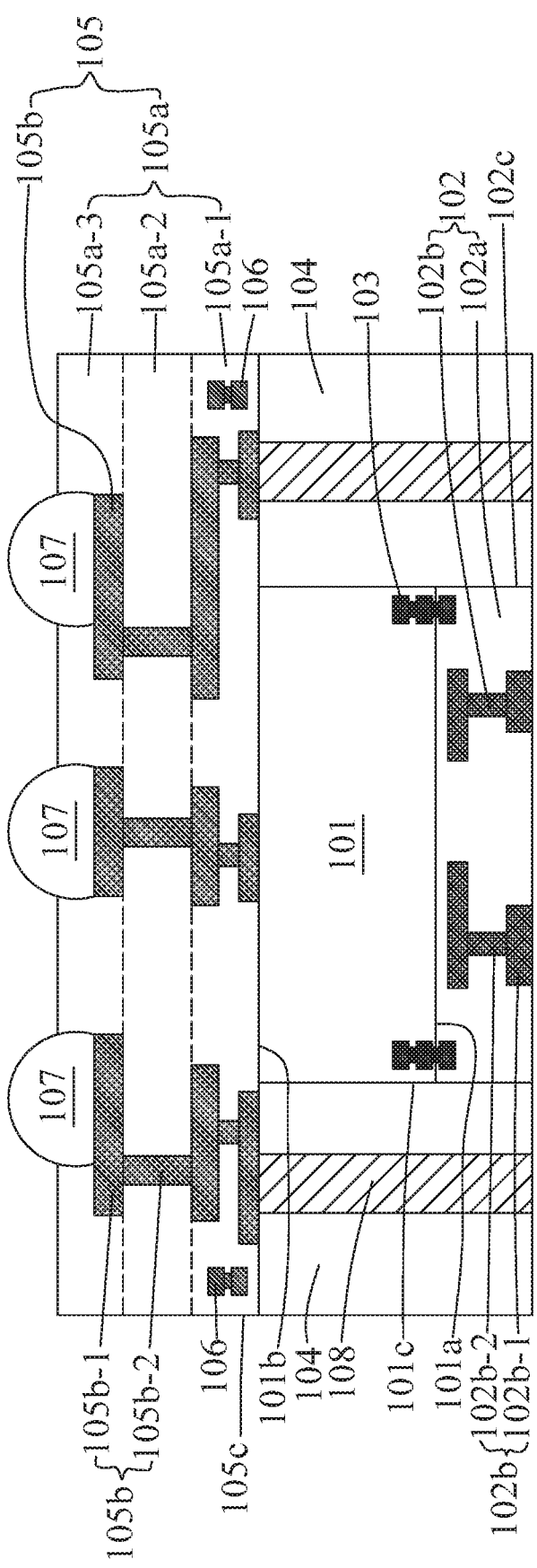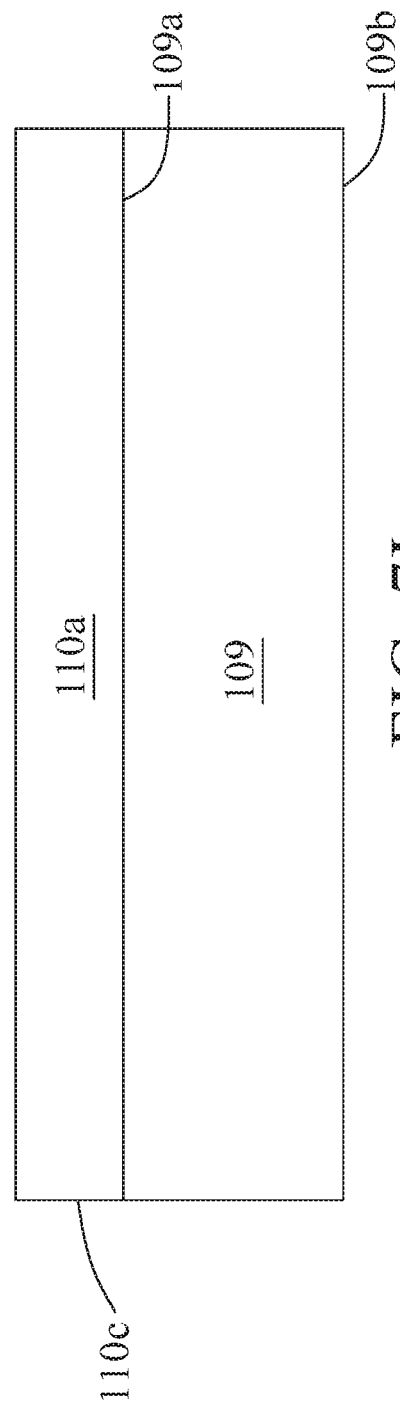
FIG. 7I

SEMICONDUCTOR STRUCTURE

PRIORITY CLAIM AND CROSS-REFERENCE

This application claims priority to U.S. patent application Ser. No. 16/122,243, filed on Sep. 5, 2018, entitled of "SEMICONDUCTOR STRUCTURE AND MANUFACTURING METHOD THEREOF", which is a continuation of U.S. patent application Ser. No. 15/676,309, filed on Aug. 14, 2017, entitled of "SEMICONDUCTOR STRUCTURE AND MANUFACTURING METHOD THEREOF", the disclosure of which is hereby incorporated by reference in its entirety.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a system on integrated chip (SoIC) is widely used to integrate several components into a single semiconductor device. During the SoIC operation, a number of components are assembled on a single semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 7A-7K are schematic views of manufacturing a semiconductor structure by a method of FIG. 6 in accordance with some embodiments of the present disclosure.

DETAILED DESCRIPTION OF THE DISCLOSURE

Figure 1:
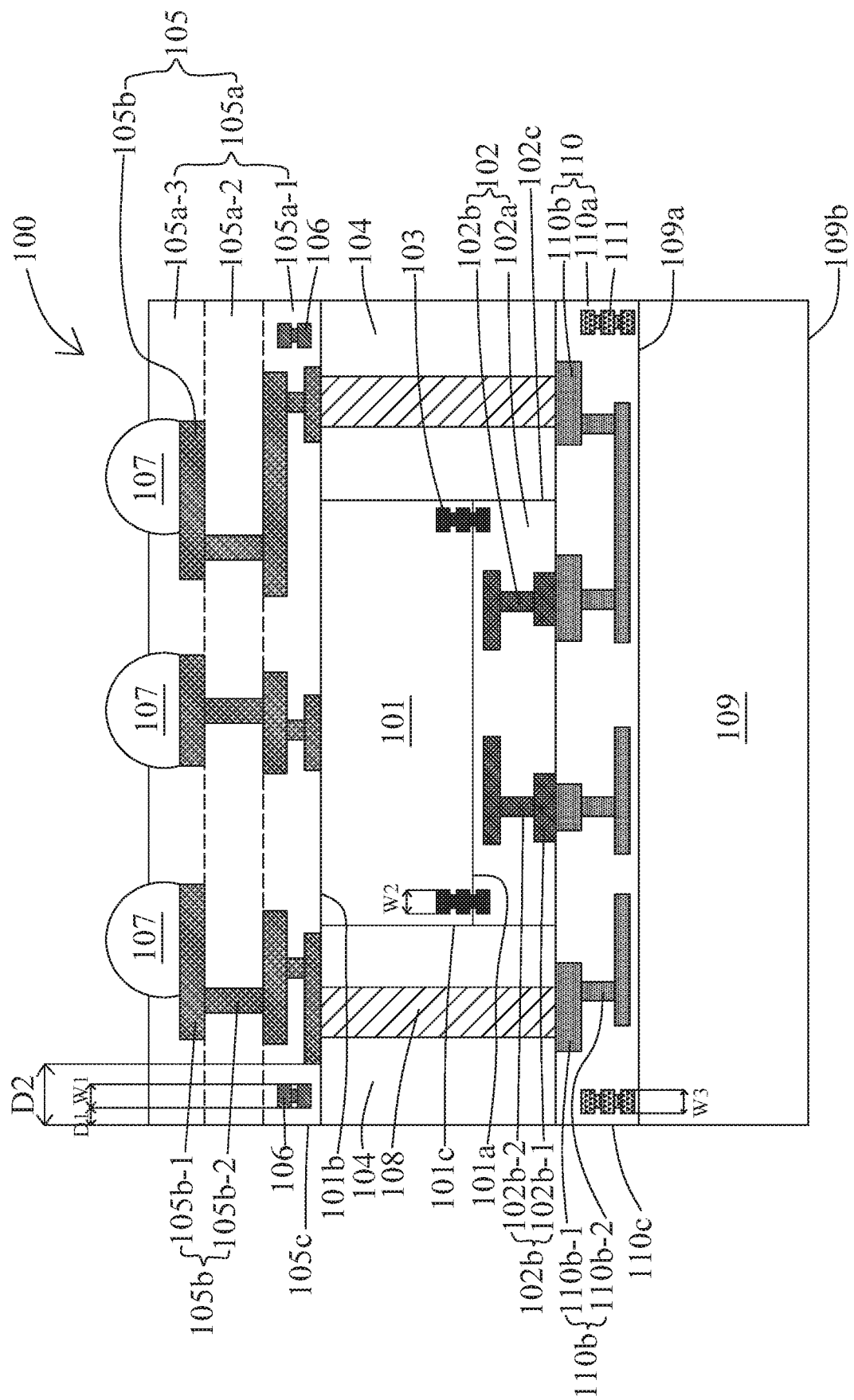
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor chip is manufactured by a number of operations. During the manufacturing process, the semiconductor chip is disposed over and bonded with a substrate or wafer and then singulated to become a semiconductor device. Upon singulation, some chippings are peeled off from the semiconductor device or some cracks are developed and propagated into the semiconductor device. The chippings and cracks would cause structural damages to the semiconductor device.

In the present disclosure, a semiconductor structure is disclosed. The semiconductor structure includes a die, a first interconnect structure disposed over a surface of the die, a molding surrounding the die and the first interconnect structure, a second interconnect structure disposed over another surface of the die and the molding, and a conductive bump disposed over the second interconnect structure. A seal ring is disposed within the second interconnect structure and adjacent to an edge of the second interconnect structure. The seal ring is configured to protect the die, the molding or the second interconnect structure from damages caused by cracks, chippings or other contaminants during fabrication or singulation. As such, delamination of components or damages on the semiconductor structure during fabrication or singulation can be minimized or prevented.

FIG. 1 is a schematic cross sectional view of a semiconductor structure 100 in accordance with various embodiments of the present disclosure. In some embodiments, the semiconductor structure 100 includes a die 101, a first interconnect structure 102, a molding 104, a second interconnect structure 105, a first seal ring 106 and a conductive bump 107.

In some embodiments, the semiconductor structure 100 is a semiconductor package. In some embodiments, the semiconductor structure 100 is an integrated fan out (InFO) package, where I/O terminals of the die 101 are fanned out and redistributed over a surface of the die 101 in a greater area. In some embodiments, the semiconductor structure 100 is a system on integrated circuit (SoIC) packaging structure. In some embodiments, the semiconductor structure 100 is a three dimensional integrated circuit (3D IC).

In some embodiments, the die 101 is fabricated with a predetermined functional circuit within the die 101. In some embodiments, the die 101 is singulated from a semiconductive wafer by a mechanical or laser blade. In some embodiments, the die 101 comprises a variety of electrical circuits suitable for a particular application. In some embodiments, the electrical circuits include various devices such as transistors, capacitors, resistors, diodes and/or the like. In some embodiments, the die 101 is a logic device die, graphics processing unit (GPU) die, application processing (AP) die, memory die, high bandwidth memory (HBM) die or the like. In some embodiments, the die 101 is a chip or a package. In some embodiments, the die 101 has a top cross section (a cross section from the top view of the semiconductor structure 100 as shown in FIG. 1) in a quadrilateral, a rectangular or a square shape.

In some embodiments, the die 101 includes a first surface 101a and a second surface 101b opposite to the first surface 101a. In some embodiments, the die 101 includes a sidewall 101c between the first surface 101a and the second surface 101b. In some embodiments, the sidewall 101c is substantially orthogonal to the first surface 101a or the second surface 101b. In some embodiments, the first surface 101a is an active side that several electrical components are disposed thereon. In some embodiments, the second surface 101b is an inactive side that electrical component disposed thereon is absent.

In some embodiments, the first interconnect structure 102 is disposed at the substrate 101. In some embodiments, the first interconnect structure 102 is disposed at the first surface 101a of the substrate 101. In some embodiments, the first interconnect structure 102 is configured to route a path of circuitry from the die 101 and redistribute I/O terminals of the die 101. In some embodiments, the first interconnect structure 102 is configured to electrically connect the die 101 with a circuitry or conductive structure external to the die 101.

In some embodiments, the first interconnect structure 102 includes a first dielectric layer 102a disposed at the first surface 101a of the die 101 and several first conductive members 102b disposed within or over the first dielectric layer 102a. In some embodiments, the first dielectric layer 102a is in contact with the first surface 101a of the die 101. In some embodiments, the first dielectric layer 102a includes several layers of dielectric material stacking over each other. In some embodiments, the first dielectric layer 102a includes dielectric material such as silicon oxide, silicon nitride, undoped silicon glass or the like. In some embodiments, the first dielectric layer 102a includes polymeric material. In some embodiments, the first dielectric layer 102a includes polyimide (PI), polybenzoxazole (PBO) or the like. In some embodiments, each layer of the first dielectric layer 102a includes dielectric material different from or same as each other.

In some embodiments, the first conductive member 102b is disposed within or over the first dielectric layer 102a. In some embodiments, the first conductive member 102b includes conductive material such as gold, silver, copper, nickel, tungsten, aluminum, tin and/or alloys thereof. In some embodiments, the first conductive member 102b extends within the first dielectric layer 102a. In some embodiments, the first conductive member 102b extends through one or more layers of the first dielectric layer 102a. In some embodiments, the first conductive member 102b is electrically connected to a circuitry of the die 101. In some embodiments, the first conductive member 102b is disposed at a central portion of the first dielectric layer 102a.

In some embodiments, the first conductive member 102b includes a first land portion 102b-1 and a first via portion 102b-2 extended from and coupled with the first land portion 102b-1. In some embodiments, the first land portion 102b-1 is laterally extended within or over the first dielectric layer 102a. In some embodiments, the first via portion 102b-2 is vertically extended within the first dielectric layer 102a and passes through at least one layer of the first dielectric layer 102a. In some embodiments, the first land portion 102b-1 and the first via portion 102b-2 are stacked over each other. In some embodiments, the first land portion 102b-1 and the first via portion 102b-2 are stacked alternately.

In some embodiments, the first land portion 102b-1 is disposed over the first dielectric layer 102a. In some embodiments, the first land portion 102b-1 is at least partially exposed from the first dielectric layer 102a. In some embodiments, the first land portion 102b-1 is a bonding pad for receiving, bonding with or electrically connecting with a conductive structure or a circuitry.

In some embodiments, the molding 104 surrounds the die 101 and the first interconnect structure 102. In some embodiments, the molding 104 is in contact with the sidewall 101c of the die 101 and an edge 102c of the first dielectric layer 102a. In some embodiments, the molding 104 can be a single layer film or a composite stack. In some embodiments, the molding 104 includes various materials, such as molding compound, molding underfill, epoxy, resin, or the like. In some embodiments, the molding 104 has a high thermal conductivity, a low moisture absorption rate and a high flexural strength. In some embodiments, the molding 104 includes oxide such as silicon oxide or the like. In some embodiments, the molding 104 includes epoxy, resin, molding compounds or the like.

In some embodiments, the second interconnect structure 105 is disposed over the second surface 101b of the die 101 and the molding 104. In some embodiments, the second interconnect structure 105 is configured to re-route a path of circuitry from the die 101 or a substrate and redistribute I/O terminals of the die 101 or the substrate. In some embodiments, the second interconnect structure 105 is configured to electrically connect the die 101 or the substrate with a circuitry or conductive structure external to the die 101 or the substrate. In some embodiments, the second interconnect structure 105 is a back side RDL.

In some embodiments, the second interconnect structure 105 includes a second dielectric layer 105*a* disposed over the second surface 101*b* of the die 101 and the molding 104, and several second conductive members 105*b* disposed within or over the second dielectric layer 105*a*. In some embodiments, the second dielectric layer 105*a* is in contact with the second surface 101*b* of the die 101. In some embodiments, the second dielectric layer 105*a* includes several layers (105*a*-1, 105*a*-2, 105*a*-3) of dielectric material stacking over each other. In some embodiments, the second dielectric layer 105*a* includes dielectric material such as silicon oxide, silicon nitride, undoped silicon glass or the like. In some embodiments, the second dielectric layer 105*a* includes polymeric material. In some embodiments, the second dielectric layer 105*a* includes polyimide (PI), polybenzoxazole (PBO) or the like. In some embodiments, each layer of the second dielectric layer 105*a* includes dielectric material different from or same as each other.

In some embodiments, a first layer 105*a*-1 of the second dielectric layer 105*a* is disposed over the second surface 101*b* of the die 101 and the molding 104. In some embodiments, the first layer 105*a*-1 includes oxide such as silicon oxide or the like. In some embodiments, a second layer 105*a*-2 is disposed over the first layer 105*a*-1. In some embodiments, the second layer 105*b*-2 includes nitride such as silicon nitride or the like. In some embodiments, a third layer 105*a*-3 is disposed over the second layer 105*b*-2. In some embodiments, the third layer 105*b*-3 includes nitride such as silicon nitride or the like. In some embodiments, the first layer 105*a*-1, the second layer 105*a*-2 and the third layer 105*a*-3 include same dielectric material as or different dielectric material from each other. Although FIG. 1 shows the second dielectric layer 105*a* includes 3 dielectric layers (105*a*-1, 105*a*-2, 105*a*-3), it would be understood that the second dielectric layer 105*a* is not limited to include 3 dielectric layers (105*a*-1, 105*a*-2, 105*a*-3). The second dielectric layer 105*b* can include one or more dielectric layers.

In some embodiments, the second conductive member 105*b* is disposed within or over the second dielectric layer 105*a*. In some embodiments, the second conductive member 105*b* includes conductive material such as gold, silver, copper, nickel, tungsten, aluminum, tin and/or alloys thereof. In some embodiments, the second conductive member 105*b* extends within the second dielectric layer 105*a*. In some embodiments, the second conductive member 105*b* extends through one or more layers of the second dielectric layer 105*a*. In some embodiments, the second conductive member 105*b* is electrically connected to a circuitry of the die 101 or a substrate. In some embodiments, the second conductive member 105*b* is disposed at a central portion of the second dielectric layer 105*a*.

In some embodiments, the second conductive member 105*b* includes a second land portion 105*b*-1 and a second via portion 105*b*-2 extended from and coupled with the second land portion 105*b*-1. In some embodiments, the second land portion 105*b*-1 is laterally extended within or over the second dielectric layer 105*a*. In some embodiments, the second via portion 105*b*-2 is vertically extended within the second dielectric layer 105*a* and passes through at least one layer of the second dielectric layer 105*a*. In some embodiments, the second land portion 105*b*-1 and the second via portion 105*b*-2 are stacked over each other. In some embodiments, the second land portion 105*b*-1 and the second via portion 105*b*-2 are stacked alternately.

In some embodiments, the second land portion 105*b*-1 is disposed over the second dielectric layer 105*a*. In some embodiments, the second land portion 105*b*-1 is at least partially exposed from the second dielectric layer 105*a*. In some embodiments, the second land portion 105*b*-1 is at least partially exposed from the first layer 105*a*-1 of the second dielectric layer 105*a*. In some embodiments, the second land portion 105*b*-1 is disposed over or is in contact with the molding 104. In some embodiments, the second land portion 105*b*-1 is a bonding pad for receiving, bonding with or electrically connecting with a conductive structure or a circuitry.

In some embodiments, the second land portion 105*b*-1 is surrounded by the second dielectric layer 105*a*. In some embodiments, the second land portion 105*b*-1 is disposed over the second layer 105*a*-2 and at least partially exposed from the third layer 105*a*-3 of the second dielectric layer 105*a*. In some embodiments, the second land portion 105*b*-1 is a bump pad for receiving, bonding with or electrically connecting with a conductive structure or a circuitry. In some embodiments, the second land portion 105*b*-1 includes a conductive material such as chromium, copper, gold, titanium, silver, nickel, palladium or tungsten, etc. In some embodiments, the second land portion 105*b*-1 is a solderable surface and serves as a platform for receiving a conductive structure.

In some embodiments, the first seal ring 106 is disposed within the second dielectric layer 105*a* and disposed over the molding 104. In some embodiments, the first seal ring 106 is disposed adjacent to an edge 105*c* of the second dielectric layer 105*a*. In some embodiments, the first seal ring 106 is extended through at least one layer of the second dielectric layer 105*a*. In some embodiments, the first seal ring 106 is extended between the first layer 105*a*-1 and the third layer 105*a*-3 of the second dielectric layer 105*a*. In some embodiments, the first seal ring 106 is extended between the first layer 105*a*-1 and the second layer 105*a*-2 of the second dielectric layer 105*a*. In some embodiments, the first seal ring 106 is laterally or vertically extended within the second dielectric layer 105*a*. In some embodiments, a portion of the second dielectric layer 105*a* is disposed between the first seal ring and the molding 104. In some embodiments, the first seal ring 106 is only disposed over the molding 104, but not disposed over the die 101. In some embodiments, the first seal ring 106 disposed over the die 101 is absent. In some embodiments, the first seal ring 106 is isolated from the molding 104.

In some embodiments, the first seal ring 106 is electrically isolated from the second conductive member 105*b*. In some embodiments, the first seal ring 106 is electrically isolated from the die 101. In some embodiments, the first seal ring 106 is a dummy structure. In some embodiments, the first seal ring 106 is electrically connected or coupled with the second conductive member 105*b*.

In some embodiments, the first seal ring 106 is configured as a barrier for preventing contaminants such as chippings, moisture, chemicals, corrosive material or etc. from penetrating into the semiconductor structure 100 or the second dielectric layer 105*a* and preventing cracks from propagating into the semiconductor structure 100 or the second dielectric layer 105*a* upon singulation or sawing operations.

In some embodiments, the first seal ring 106 is disposed closer to the edge 105*c* of the second dielectric layer 105*a* than the second conductive member 105*b*. In some embodiments, a distance D2 between the edge 105*c* of the second dielectric layer 105*b* and the second conductive member 105b is substantially greater than a distance D1 between the edge 105c of the second dielectric layer and the first seal ring 106.

Figure 2:
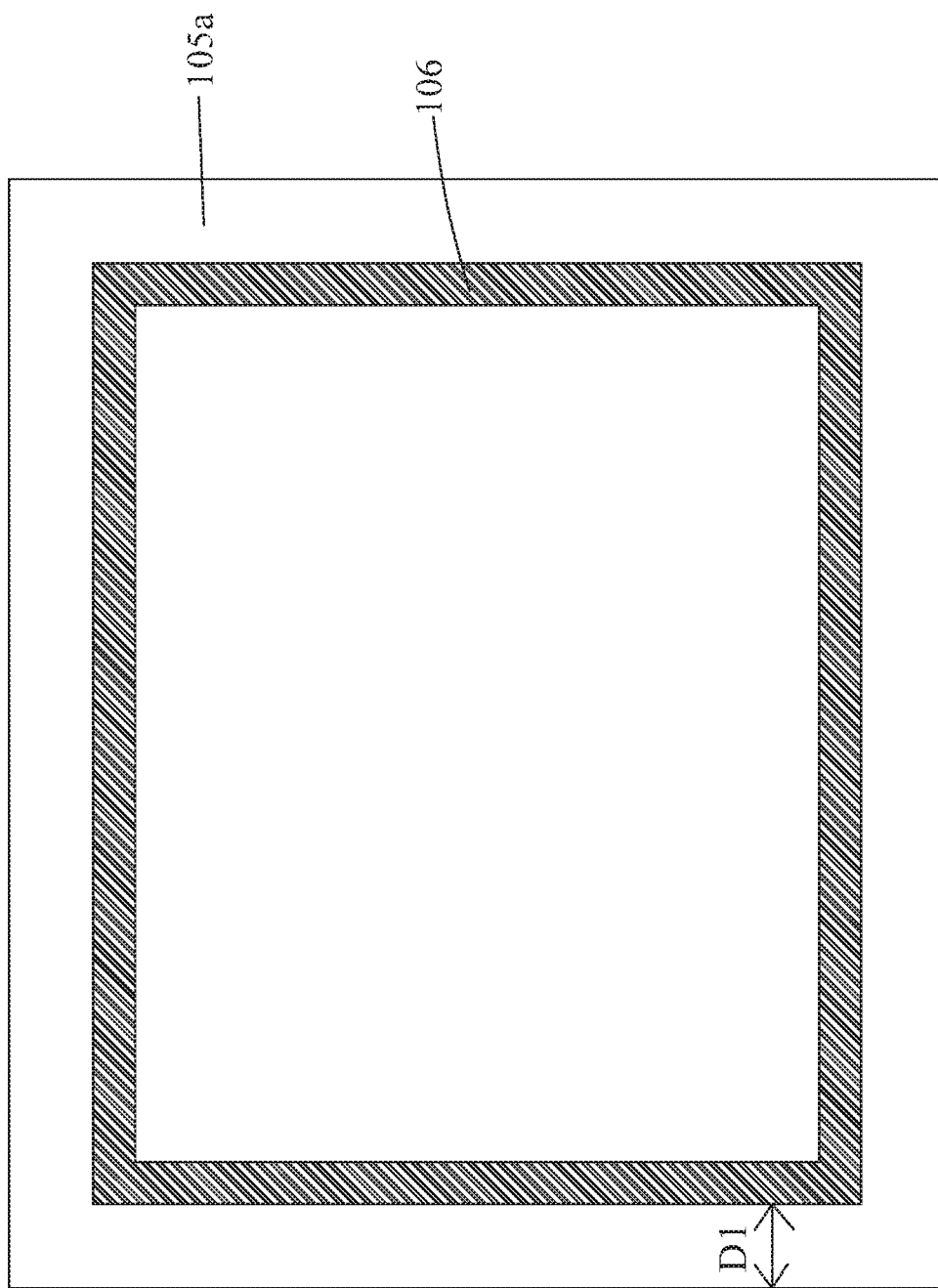
FIG. 2 is a schematic top cross sectional view of a second dielectric layer and a first seal ring in FIG. 1.

FIG. 2 is a schematic top cross section view of the semiconductor structure 100. In some embodiments, the first seal ring 106 is extended along the edge 105c of the second dielectric layer 105a. In some embodiments, the first seal ring 106 is extended to surround the second conductive member 105b. In some embodiments, a top cross section of the first seal ring 106 is in a strip or frame shape.

Referring back to FIG. 1, in some embodiments, the conductive bump 107 is disposed over the second interconnect structure 105. In some embodiments, the conductive bump 107 is disposed over and electrically connected to the second conductive member 105b. In some embodiments, the conductive bump 107 is disposed over and electrically connected to the second land portion 105b-1 of the second conductive member 105b.

In some embodiments, the conductive bump 107 is electrically connected to the first seal ring 106. In some embodiments, the conductive bump 107 is electrically connected to the first seal ring 106 through the second conductive member 105b. In some embodiments, the conductive bump 107 is bonded with the second conductive member 105b. In some embodiments, the conductive bump 107 is bonded with the second land portion 105b-1. In some embodiments, the conductive bump 107 is at least partially exposed from the second dielectric layer 105a. In some embodiments, an outer surface of the conductive bump 107 is in contact with the second dielectric layer 105a or the third layer 105a-3 of the second dielectric layer 105a.

In some embodiments, the conductive bump 107 is in a cylindrical, spherical or hemispherical shape. In some embodiments, the conductive bump 107 is a solder joint, a solder bump, a solder ball, a ball grid array (BGA) ball, a controlled collapse chip connection (C4) bump, microbump or the like. In some embodiments, the conductive bump 107 is a conductive pillar or post. In some embodiments, the conductive bump 107 includes metals such as lead, tin, copper, gold, nickel, etc. In some embodiments, the conductive bump 107 is configured to bond over another substrate or package and to electrically connect a circuitry of the semiconductor structure 100 with a circuitry of another substrate or package.

In some embodiments, a second seal ring 103 is disposed within the die 101 or the first interconnect structure 102. In some embodiments, the second seal ring 103 is vertically extended within the die 101 or the first dielectric layer 102a. In some embodiments, the second seal ring 103 is disposed adjacent to the sidewall 101c of the die 101. In some embodiments, the second seal ring 103 is disposed adjacent to the edge 102c of the first dielectric layer 102a. In some embodiments, the second seal ring 103 is disposed adjacent to the molding 103. In some embodiments, the second seal ring 103 is electrically isolated from the first conductive member 102b. In some embodiments, the second seal ring 103 is a dummy structure. In some embodiments, the second seal ring 103 is configured as a barrier for preventing contaminants such as chippings, moisture, chemicals, corrosive material or etc. from penetrating into the die 101 and preventing cracks from propagating into the die 101 upon singulation or sawing operations. In some embodiments, a width W1 of the first seal ring 106 is substantially greater than a width W2 of the second seal ring 103.

In some embodiments, a via 108 is disposed and extended within the molding 104. In some embodiments, the via 108 is extended through the molding 104. In some embodiments, the via 108 is electrically connected to the second conductive member 105b. In some embodiments, the via 108 is bonded with the second land portion 105b-1 of the second conductive member 105b. In some embodiments, an end of the via 108 is at least partially exposed from the molding 104. In some embodiments, the via 108 is electrically isolated from the first seal ring 106. In some embodiments, the first seal ring 106 coupled with the via 108 is absent. In some embodiments, the first seal ring 106 is not connected to or not coupled with the via 108. In some embodiments, the via 108 includes a conductive material such as copper, silver, gold, aluminum, etc. In some embodiments, the via 108 is a through molding via (TMV) or through oxide via (TOV). In some embodiments, a height of the via 108 is substantially same as a total of a thickness of the die 101 and a thickness of the first dielectric layer 102a.

In some embodiments, the semiconductor structure 100 includes a substrate 109, a third interconnect structure 110 disposed over the substrate 109. In some embodiments, the die 101 and the molding 104 are disposed over the substrate 109. In some embodiments, the substrate 109 is a semiconductive substrate. In some embodiments, the substrate 109 includes semiconductive material such as silicon, germanium, gallium, arsenic, or combinations thereof. In some embodiments, the substrate 109 is a silicon substrate or silicon interposer. In some embodiments, the substrate 109 includes material such as ceramic, glass, polymer or the like. In some embodiments, the substrate 109 includes organic material. In some embodiments, the substrate 109 is fabricated with a predetermined functional circuit thereon. In some embodiments, the substrate 109 includes several conductive traces and several electrical components such as transistor, diode, etc. disposed within the substrate 109. In some embodiments, the substrate 109 is a printed circuit board (PCB). In some embodiments, the substrate 109 has a quadrilateral, rectangular, square, polygonal or any other suitable shape.

In some embodiments, the substrate 109 includes a third surface 109a and a fourth surface 109b opposite to the third surface 109a. In some embodiments, the third surface 109a is an active side that several electrical components are disposed thereon. In some embodiments, the fourth surface 109b is an inactive side that electrical component disposed thereon is absent.

In some embodiments, the third interconnect structure 110 is disposed over the third surface 109a of the substrate 109. In some embodiments, the third interconnect structure 110 is configured to route a path of circuitry from the substrate 109. In some embodiments, the third interconnect structure 110 is configured to electrically connect the die 101.

In some embodiments, the third interconnect structure 110 includes a third dielectric layer 110a disposed over the third surface 109a of the substrate 109, and several third conductive members 110b disposed within or over the third dielectric layer 110a. In some embodiments, the third dielectric layer 110a is in contact with the third surface 109a of the substrate 109. In some embodiments, the molding 104 is disposed over the third dielectric layer 110a. In some embodiments, the die 101 is disposed over the third dielectric layer 110a. In some embodiments, the third dielectric layer 110a includes several layers of dielectric material stacking over each other. In some embodiments, the third dielectric layer 110a includes dielectric material such as silicon oxide, silicon nitride, undoped silicon glass or the like. In some embodiments, the third dielectric layer 110a includes polymeric material. In some embodiments, the third dielectric layer 110a includes polyimide (PI), polybenzoxazole (PBO) or the like. In some embodiments, each layer of the third dielectric layer 110a includes dielectric material different from or same as each other.

In some embodiments, the third conductive member 110b is disposed within or over the third dielectric layer 110a. In some embodiments, the third conductive member 110b is bonded with the first conductive member 102b. In some embodiments, the third conductive member 110b includes conductive material such as gold, silver, copper, nickel, tungsten, aluminum, tin and/or alloys thereof. In some embodiments, the third conductive member 110b extends within the third dielectric layer 110a. In some embodiments, the third conductive member 110b extends through one or more layers of the third dielectric layer 110a. In some embodiments, the third conductive member 110b is electrically connected to a circuitry of the substrate 109. In some embodiments, the third conductive member 110b is disposed at a central portion of the third dielectric layer 110a.

In some embodiments, the third conductive member 110b includes a third land portion 110b-1 and a third via portion 110b-2 extended from and coupled with the third land portion 110b-1. In some embodiments, the third land portion 110b-1 is laterally extended within or over the third dielectric layer 110a. In some embodiments, the third via portion 110b-2 is vertically extended within the third dielectric layer 110a and passes through at least one layer of the third dielectric layer 110a. In some embodiments, the third land portion 110b-1 and the third via portion 110b-2 are stacked over each other. In some embodiments, the third land portion 110b-1 and the third via portion 110b-2 are stacked alternately.

In some embodiments, the third land portion 110b-1 is disposed over the third dielectric layer 110a. In some embodiments, the third land portion 110b-1 is at least partially exposed from the third dielectric layer 110a. In some embodiments, the third land portion 110b-1 is disposed over or is in contact with the molding 104. In some embodiments, the third land portion 110b-1 is a bonding pad for receiving, bonding with or electrically connecting with a conductive structure or a circuitry.

In some embodiments, the third land portion 110b-1 is coupled or bonded with the via 108. In some embodiments, the third land portion 110b-1 is coupled or bonded with the first conductive member 102b. In some embodiments, the third land portion 110b-1 is coupled or bonded with the first land portion 102b-1 of the first conductive member 102b. In some embodiments, the third land portion 110b-1 is eutectically bonded with the first land portion 102b-1. In some embodiments, the third land portion 110b-1 is vertically aligned with the first land portion 102b-1.

In some embodiments, a third seal ring 111 is disposed within the third dielectric layer 110a. In some embodiments, the third seal ring 111 is vertically extended within the third dielectric layer 110a. In some embodiments, the third seal ring 111 is disposed adjacent to an edge 110c of the third dielectric layer 110a. In some embodiments, the third seal ring 111 is electrically isolated from the third conductive member 110b. In some embodiments, the third seal ring 111 is a dummy structure. In some embodiments, the third seal ring 111 is vertically aligned with the first seal ring 106. In some embodiments, the third seal ring 111 is configured as a barrier for preventing contaminants such as chippings, moisture, chemicals, corrosive material or etc. from penetrating into the substrate 109 and preventing cracks from propagating into the substrate 109 upon singulation or sawing operations. In some embodiments, the width W1 of the first seal ring 106 is substantially greater than a width W3 of the third seal ring 111.

Figure 3:
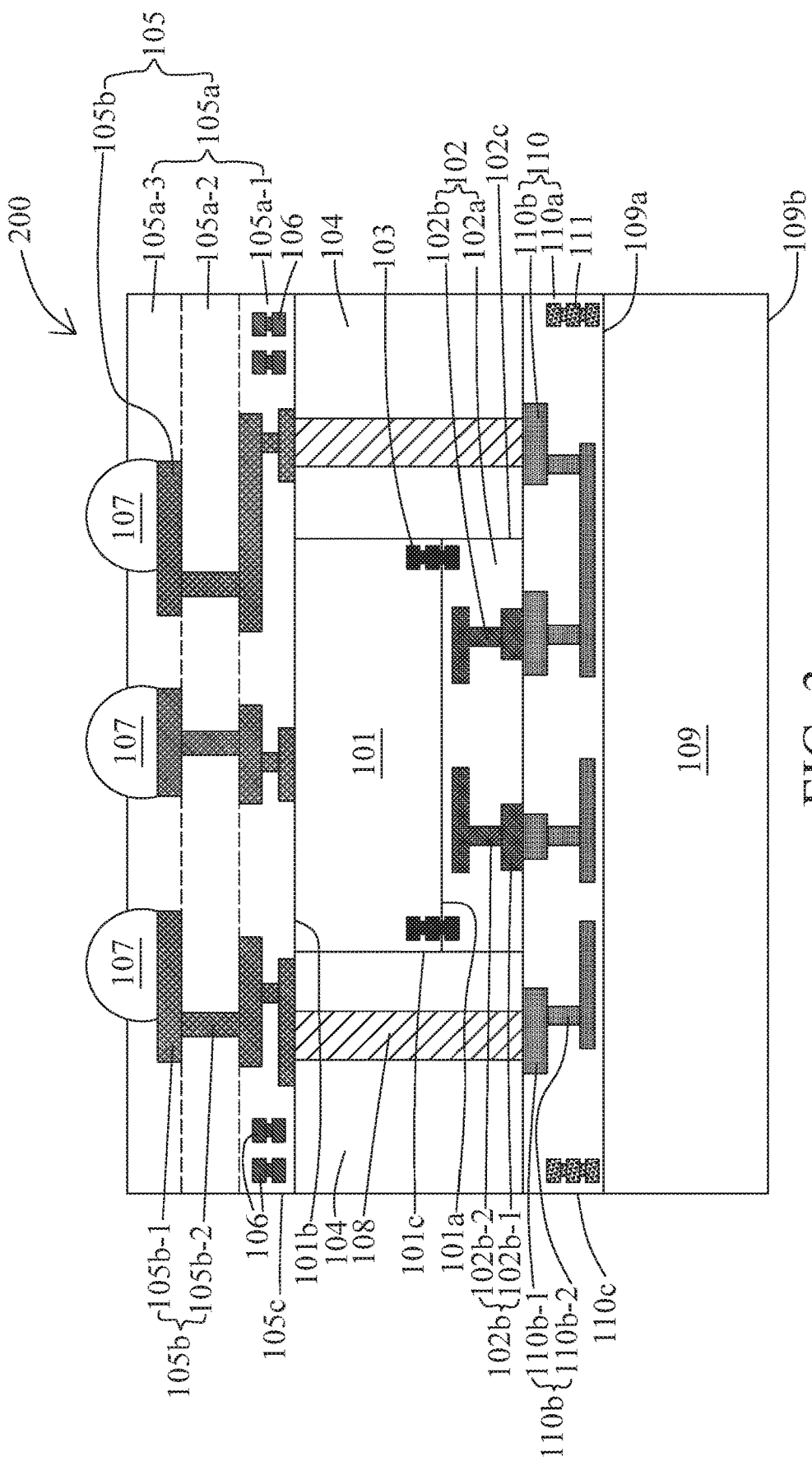
FIG. 3 is a schematic cross sectional view of a semiconductor structure in accordance with some embodiments of the present disclosure.
Figure 4:
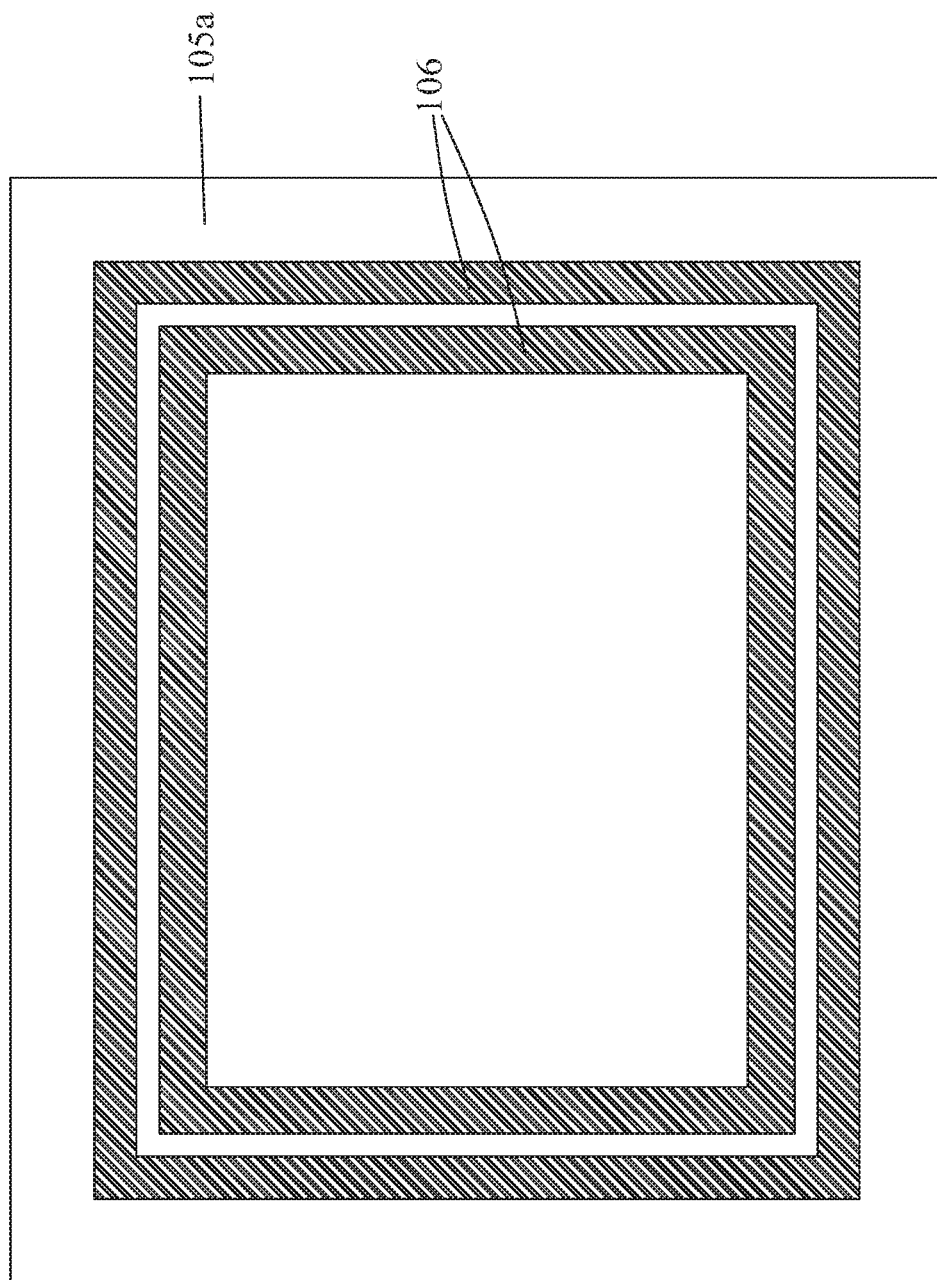
FIG. 4 is a schematic top cross sectional view of a second dielectric layer and a first seal ring in FIG. 3.

FIG. 3 is a schematic cross sectional view of a semiconductor structure 200 in accordance with various embodiments of the present disclosure, and FIG. 4 is a schematic top cross sectional view of the semiconductor structure 200. In some embodiments, the semiconductor structure 200 includes the die 101, the first interconnect structure 102, the molding 104, the second interconnect structure 105, the first seal ring 106, the conductive bump 107, the substrate 109 and the third interconnect structure 110, which have similar configurations as those described above or illustrated in FIG. 1.

In some embodiments, the semiconductor structure 200 includes more than one first seal rings 106 disposed within the first dielectric layer 102a. In some embodiments as shown in FIGS. 3 and 4, two first seal rings 106 are extended along the edge 105c of the second dielectric layer 105a. In some embodiments, two first seal rings 106 are extended to surround the second conductive structure 105b. In some embodiments, top cross sections of two first seal rings 106 are in strip or frame shape.

Figure 5:
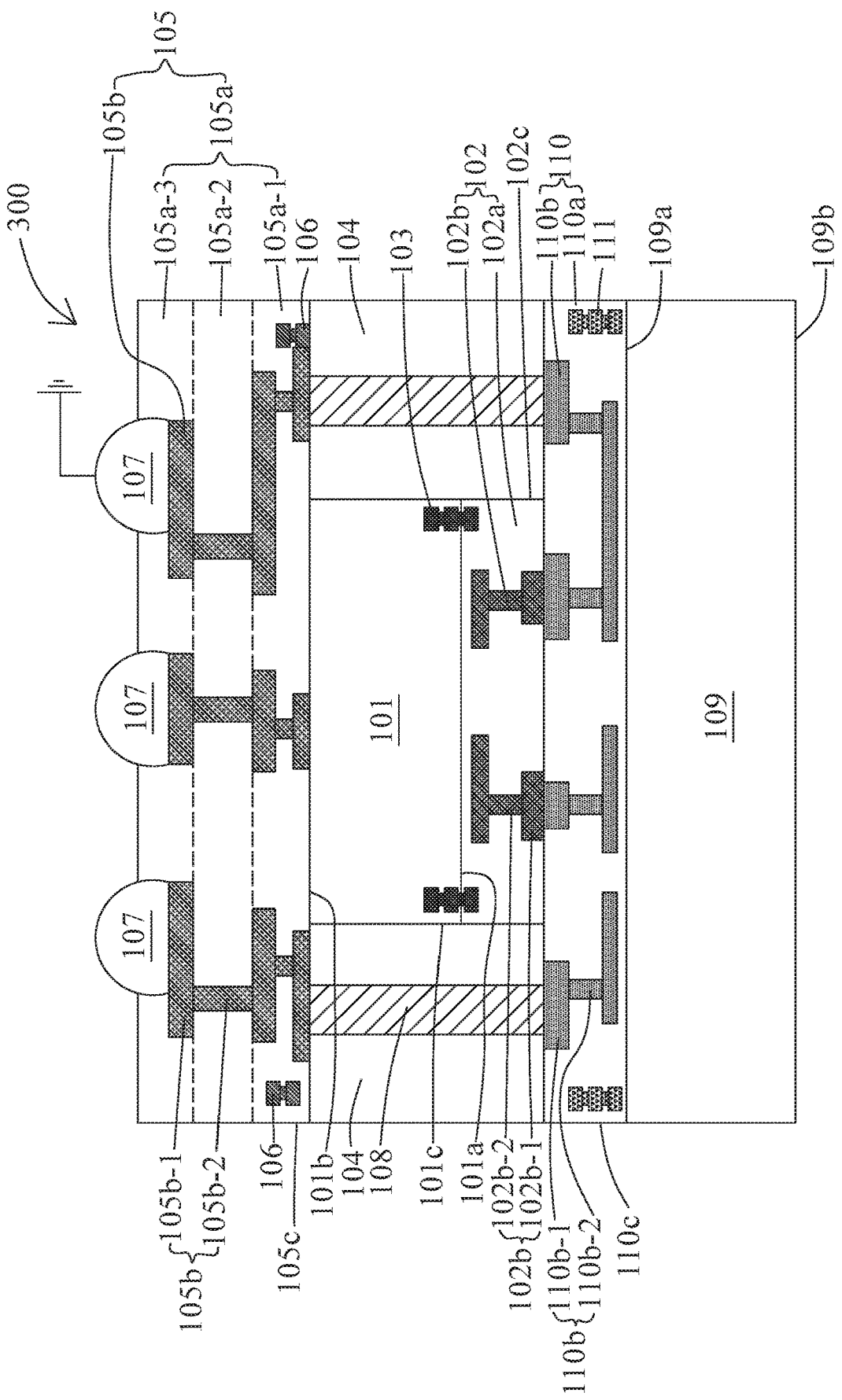
FIG. 5 is a schematic cross sectional view of a semiconductor structure in accordance with some embodiments of the present disclosure.

FIG. 5 is a schematic top cross section view of the semiconductor structure 300. In some embodiments, the semiconductor structure 300 includes the die 101, the first interconnect structure 102, the molding 104, the second interconnect structure 105, the first seal ring 106, the conductive bump 107, the substrate 109 and the third interconnect structure 110, which have similar configurations as those described above or illustrated in FIG. 1. In some embodiments, the first seal ring 106 is in contact with the second conductive member 105b. In some embodiments, the first seal ring 106 is connected to an electrical ground. In some embodiments, the conductive bump 107 is connected to the electrical ground. In some embodiments, the first seal ring 106 is connected to the electrical ground through the conductive bump 107 or the second conductive member 105b.

Figure 6:
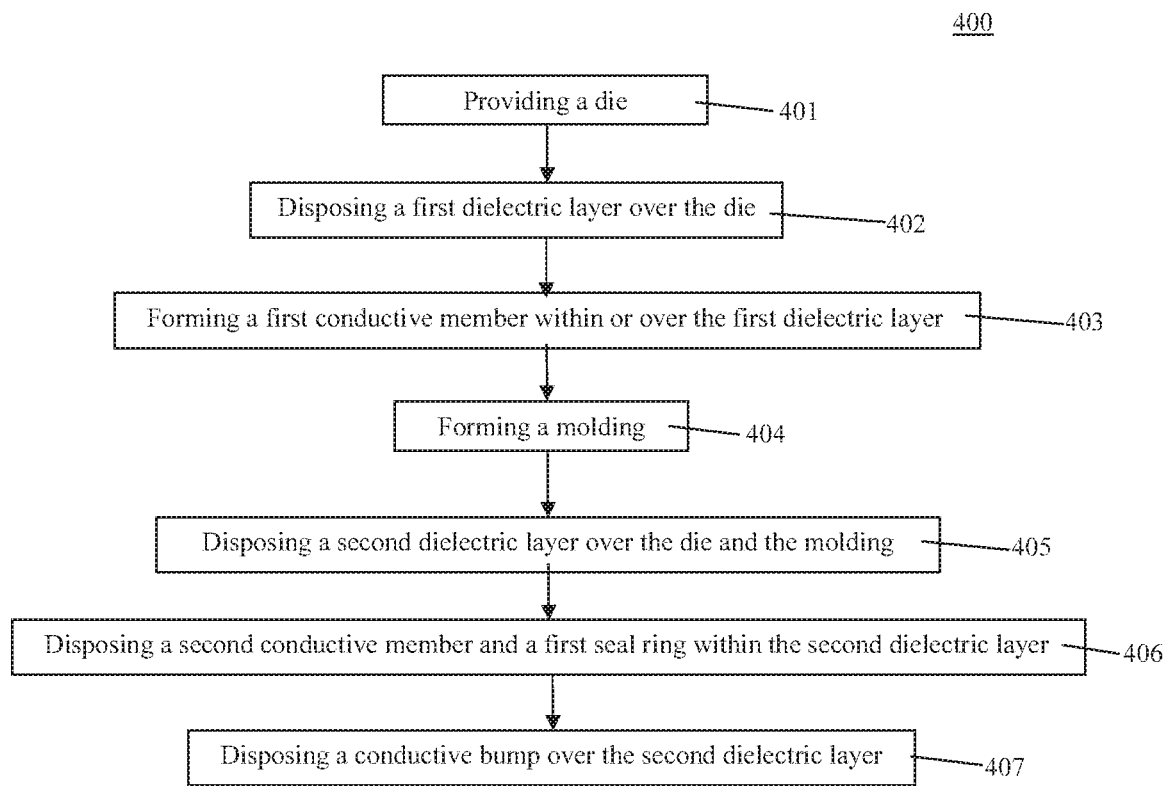
FIG. 6 is a flow diagram of a method of manufacturing a semiconductor structure in accordance with some embodiments of the present disclosure.

In the present disclosure, a method of manufacturing a semiconductor structure (100, 200, 300) is also disclosed. In some embodiments, the semiconductor structure (100, 200, 300) is formed by a method 400. The method 400 includes a number of operations and the description and illustration are not deemed as a limitation as the sequence of the operations. FIG. 6 is an embodiment of the method 400 of manufacturing the semiconductor structure (100, 200, 300). The method 400 includes a number of operations (401, 402, 403, 404, 405, 406 and 407).

In operation 401, a die 101 is provided or received as shown in FIG. 7A. In some embodiments, the die 101 includes a first surface 101a and a second surface 101b opposite to the first surface 101a. In some embodiments, the die 101 is a chip or a package. In some embodiments, the die 101 has configuration similar to the one described above or illustrated in FIG. 1, 3 or 5.

In operation 402, a first dielectric layer 102a is disposed at the die 101 as shown in FIG. 7B. In some embodiments, the first dielectric layer 102a is disposed at the first surface 101a of the die 101. In some embodiments, the first dielectric layer 102a includes several layers of dielectric material stacking over each other. In some embodiments, the first dielectric layer 102a includes dielectric material such as silicon oxide, silicon nitride, undoped silicon glass or the like. In some embodiments, the first dielectric layer 102a includes polymeric material such as polyimide (PI), polybenzoxazole (PBO) or the like. In some embodiments, the first dielectric layer 102a is deposited by spin coating, chemical vapor deposition (CVD), plasma-enhanced CVD (PECVD), high-density plasma CVD (HDPCVD) or any other suitable operations.

In operation 403, a first conductive member 102b is formed within or over the first dielectric layer 102a as shown in FIG. 7C. In some embodiments, the first conductive member 102b is extended through at least one layer of the first dielectric layer 102a. In some embodiments, the first conductive member 102b is formed by removing a portion of the first dielectric layer 102a to form an opening and then disposing a conductive material into the opening. In some embodiments, the removal of the portion of the first dielectric layer 102a includes photolithography, etching or any other suitable operations. In some embodiments, the disposing of the conductive material includes sputtering, electroplating or any other suitable operations. In some embodiments, the conductive material includes copper, silver, gold, aluminum, etc.

In some embodiments, the first conductive member 102b includes a first land portion 102b-1 and a first via portion 102b-2 coupled with the first land portion 102b-1. In some embodiments, the first land portion 102b-1 and the first via portion 102b-2 are stacked over each other. In some embodiments, the first land portion 102b-1 and the first via portion 102b-2 are stacked alternately. In some embodiments, a first interconnect structure 102 including the first dielectric layer 102a and the first conductive member 102b is formed over the die 101 or the first surface 101a of the die 101. In some embodiments, the first interconnect structure 102, the first dielectric layer 102a and the first conductive member 102b have configuration similar to those described above or illustrated in FIG. 1, 3 or 5.

In some embodiments, a second seal ring 103 is formed within the die 101 or the first dielectric layer 102a. In some embodiments, the second seal ring 103 is formed adjacent to a sidewall 101c of the die 101 or an edge 102c of the first dielectric layer 102a. In some embodiments, the second seal ring 103 is electrically isolated from the first conductive member 102b. In some embodiments, the second seal ring 103 is formed by removing a portion of the die 101 or a portion of the first dielectric layer 102a to form an opening, and then disposing a conductive material into the opening. In some embodiments, the removal of the portion of the die 101 and the portion of the first dielectric layer 102a includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the second seal ring 103 has configuration similar to those described above or illustrated in FIG. 1, 3 or 5.

Figure 7D:
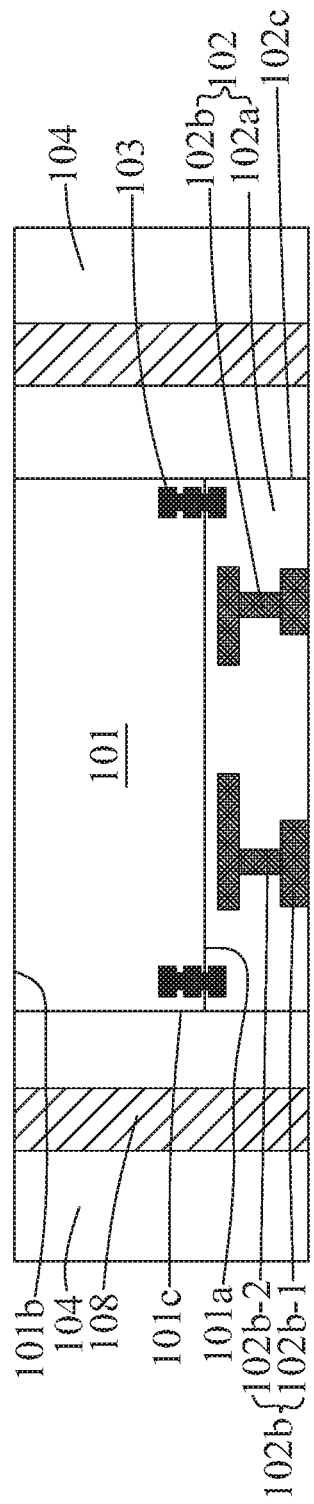

In operation 404, a molding 104 is formed as shown in FIG. 7D. In some embodiments, the molding 104 is disposed around the die 101 and the first dielectric layer 102a. In some embodiments, the molding 104 is in contact with the sidewall 101c of the die 101 and the edge 102c of the first dielectric layer 102a. In some embodiments, the molding 104 is formed by transfer molding, injection molding, over molding or any other suitable operations. In some embodiments, the molding 104 includes various materials, such as oxide, molding compound, epoxy, resin, or the like. In some embodiments, the molding 104 has configuration similar to the one described above or illustrated in FIG. 1, 3 or 5.

In some embodiments, a via 108 is formed within the molding 104. In some embodiments, the via 108 is extended through the molding 104. In some embodiments, the via 108 is a through molding via (TMV) or through oxide via (TOV). In some embodiments, the via 108 is formed by removing a portion of the molding 104 to form an opening, and then disposing a conductive material into the opening. In some embodiments, the removal of the portion of the molding 104 includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the via 108 has configuration similar to the one described above or illustrated in FIG. 1, 3 or 5.

Figure 7E:
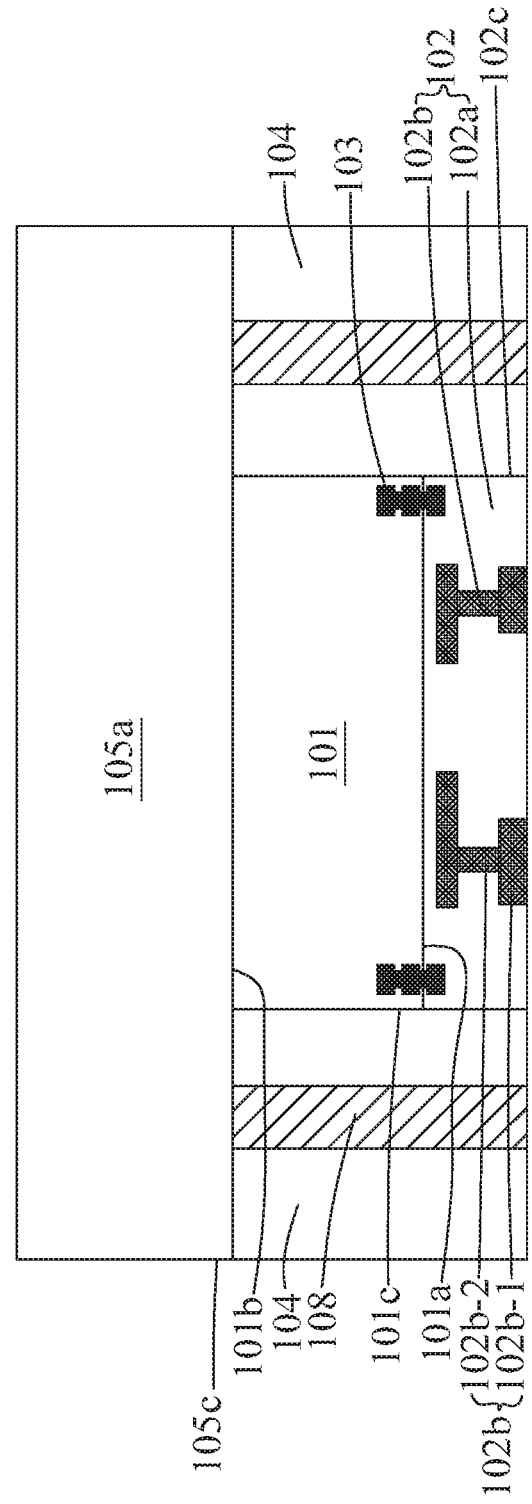

In operation 405, a second dielectric layer 105a is disposed over the second surface 101b of the die 101 and the molding 104 as shown in FIG. 7E. In some embodiments, the second dielectric layer 105a includes several layers of dielectric material stacking over each other. In some embodiments, the second dielectric layer 105a includes dielectric material such as silicon oxide, silicon nitride, undoped silicon glass or the like. In some embodiments, the second dielectric layer 105a includes polymeric material such as polyimide (PI), polybenzoxazole (PBO) or the like. In some embodiments, the second dielectric layer 105a is deposited by spin coating, chemical vapor deposition (CVD), plasma-enhanced CVD (PECVD), high-density plasma CVD (HDPCVD) or any other suitable operations. In some embodiments, the second dielectric layer 105a has configuration similar to the one described above or illustrated in FIG. 1, 3 or 5.

In some embodiments, the second dielectric layer 105a includes several layers (105a-1, 105a-2, 105a-3) stacking over each other. In some embodiments, a first layer 105a-1 is disposed over the second surface 101b of the die 101 and the molding 104, then a second layer 105a-2 is disposed over the first layer 105a-1, and then a third layer 105a-3 is disposed over the second layer 105a-2. In some embodiments, each layer (105a-1, 105a-2, 105a-3) of the second dielectric layer 105a includes dielectric material different from or same as each other.

Figure 7F:
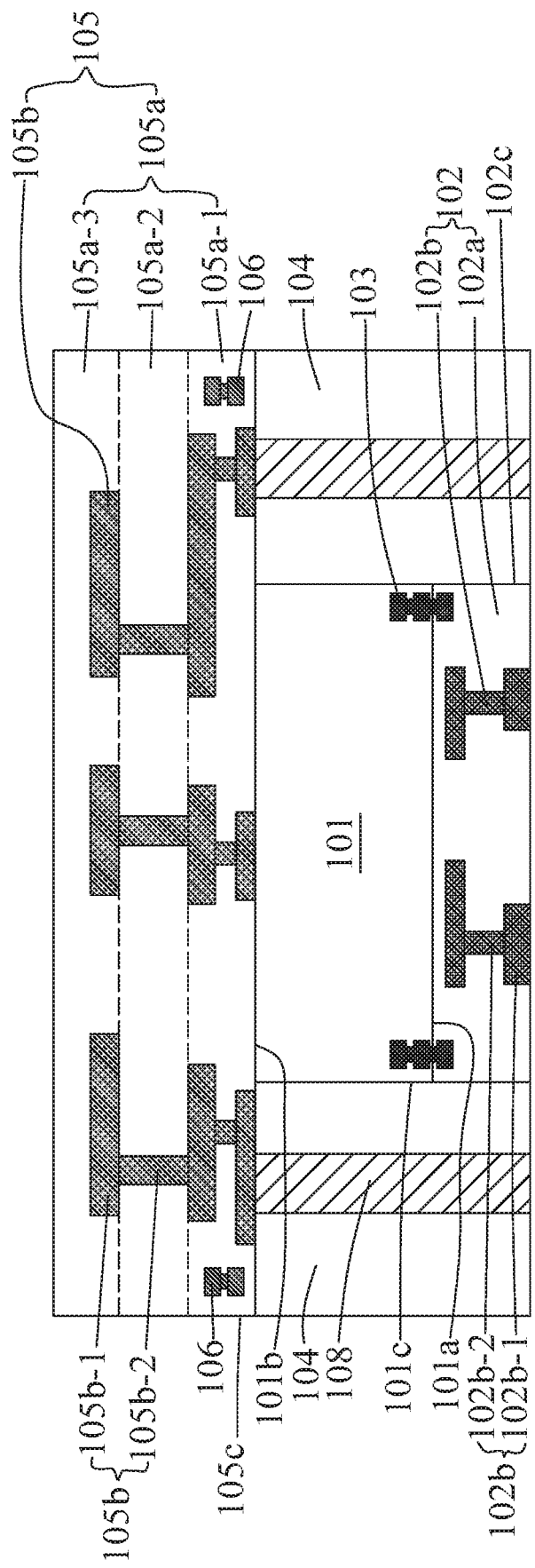

In operation 406, a second conductive member 105b and a first seal ring 106 are disposed within the second dielectric layer 105a as shown in FIG. 7F. In some embodiments, the second conductive member 105b is extended through at least one layer of the second dielectric layer 105a. In some embodiments, the second conductive member 105b is formed at a central portion of the second dielectric layer 105a. In some embodiments, the second conductive member 105b is electrically connected to or bonded with the via 108. In some embodiments, the second conductive member 105b is formed by removing a portion of the second dielectric layer 105a to form an opening and then disposing a conductive material into the opening. In some embodiments, the removal of the portion of the second dielectric layer 105a includes photolithography, etching or any other suitable operations. In some embodiments, the disposing of the conductive material includes sputtering, electroplating or any other suitable operations. In some embodiments, the conductive material includes copper, silver, gold, aluminum, etc.

In some embodiments, the second conductive member 105b includes a second land portion 105b-1 and a second via portion 105b-2 coupled with the second land portion 105b-1. In some embodiments, the second land portion 105b-1 and the second via portion 105b-2 are stacked over each other. In some embodiments, the second land portion 105b-1 and the second via portion 105b-2 are stacked alternately. In some embodiments, a second interconnect structure 105 including the second dielectric layer 105*a* and the second conductive member 105*b* is formed over the die 101 and the molding 104. In some embodiments, the second interconnect structure 105, the second dielectric layer 105*a* and the second conductive member 105*b* have configuration similar to those described above or illustrated in FIG. 1, 3 or 5.

In some embodiments, a first seal ring 106 is formed within the second dielectric layer 105*a*. In some embodiments, the first seal ring 106 is formed adjacent to edge 105*c* of the second dielectric layer 105*a*. In some embodiments, the first seal ring 106 is formed over the molding 104. In some embodiments, the first seal ring 106 is electrically isolated from the second conductive member 105*b*. In some embodiments, the first seal ring 106 is electrically connected to the second conductive member 105*b*. In some embodiments, the first seal ring 106 is connected to electrical ground. In some embodiments, the first seal ring 106 is vertically extended within at least one layer of the second dielectric layer 105*a*.

In some embodiments, the first seal ring 106 is formed by removing a portion of the second dielectric layer 105*a* adjacent to the edge 105*c* of the second dielectric layer 105*a* to form a recess, and then disposing a conductive material into the recess. In some embodiments, the removal of the portion of the second dielectric layer 105*a* includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the first seal ring 106 has configuration similar to those described above or illustrated in FIG. 1, 3 or 5.

Figure 7G:
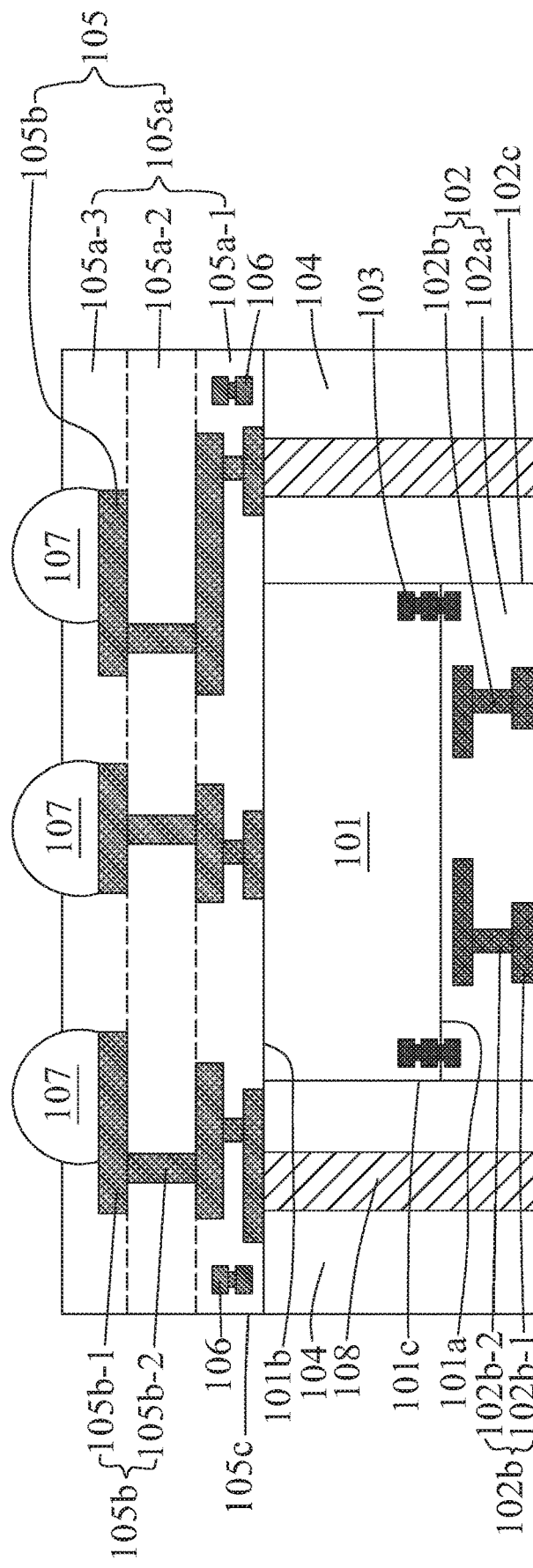

In operation 407, a conductive bump 107 is disposed over the second dielectric layer 105*b* as shown in FIG. 7G. In some embodiments, the conductive bump 107 is disposed over and electrically connected to the second conductive member 105*b*. In some embodiments, the conductive bump 107 is disposed over and electrically connected to the second land portion 105*b*-1. In some embodiments, the conductive bump 107 is disposed over the second conductive member 105*b*, and then the third layer 105*a*-3 of the second dielectric layer 105*a* is disposed over the second conductive member 105*b* to surround the conductive bump 107.

In some embodiments, the conductive bump 107 is disposed by ball dropping, solder pasting, stencil printing or any other suitable operations. In some embodiments, the conductive bump 107 is a solder joint, a solder bump, a solder ball, a ball grid array (BGA) ball, a controlled collapse chip connection (C4) bump, microbump or the like. In some embodiments, the conductive bump 107 is a conductive pillar or post. In some embodiments, the conductive bump 107 has configuration similar to the one described above or illustrated in FIG. 1, 3 or 5.

Figure 7H:
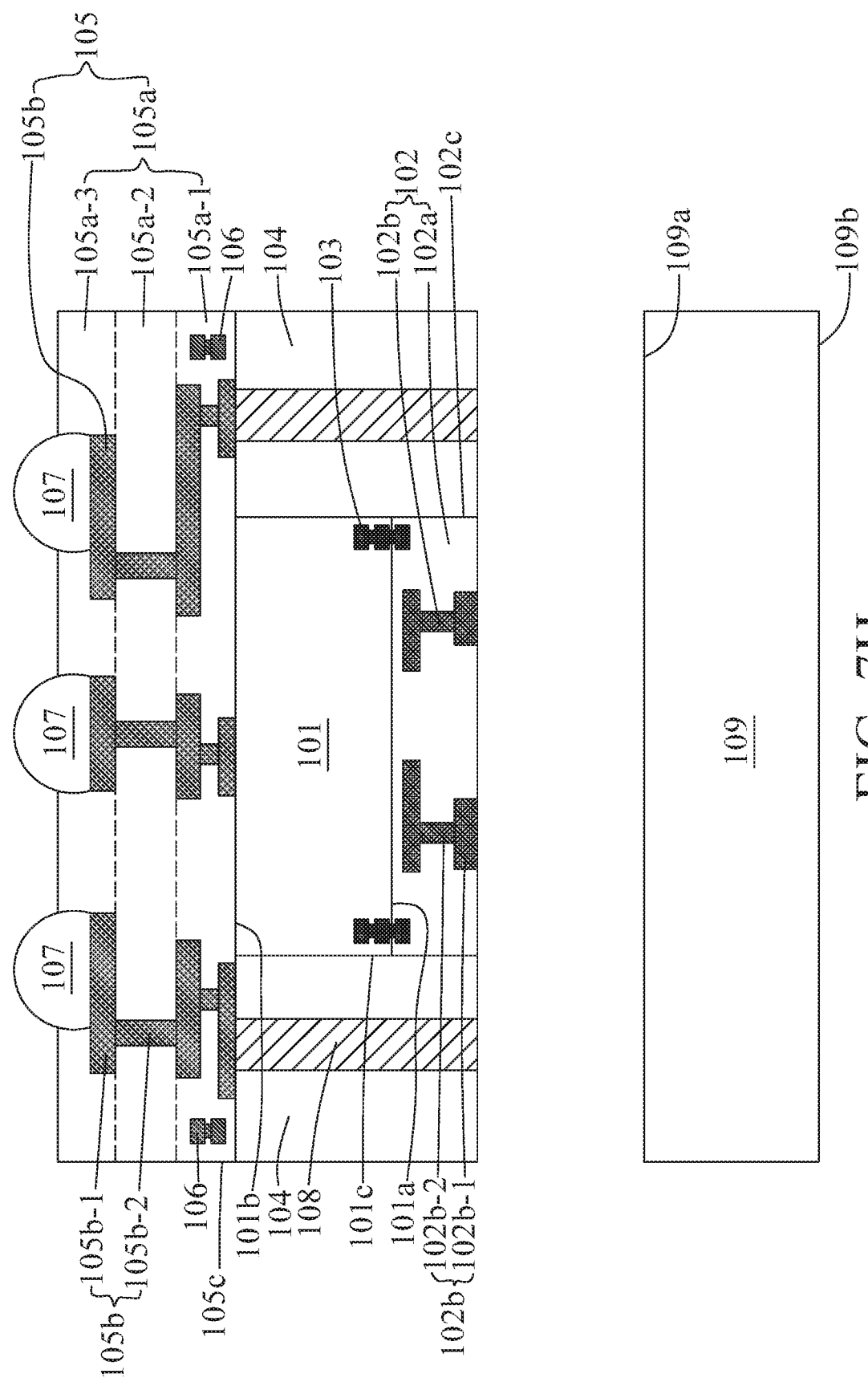

In some embodiments, a substrate 109 is provided or received as shown in FIG. 7H. In some embodiments, the substrate 109 is a semiconductive substrate. In some embodiments, the substrate 109 includes semiconductive material such as silicon, germanium, gallium, arsenic, or combinations thereof. In some embodiments, the substrate 109 is a silicon substrate or silicon interposer. In some embodiments, the substrate 109 includes material such as ceramic, glass, polymer or the like. In some embodiments, the substrate 109 includes organic material. In some embodiments, the substrate 109 is a printed circuit board (PCB). In some embodiments, the substrate 109 includes a third surface 109*a* and a fourth surface 109*b* opposite to the third surface 109*a*.

In some embodiments, a third dielectric layer 110*a* is disposed at the substrate 109 as shown in FIG. 7I. In some embodiments, the third dielectric layer 110*a* includes several layers of dielectric material stacking over each other. In some embodiments, the third dielectric layer 110*a* includes dielectric material such as silicon oxide, silicon nitride, undoped silicon glass or the like. In some embodiments, the third dielectric layer 110*a* includes polymeric material such as polyimide (PI), polybenzoxazole (PBO) or the like. In some embodiments, the third dielectric layer 110*a* is deposited by spin coating, chemical vapor deposition (CVD), plasma-enhanced CVD (PECVD), high-density plasma CVD (HDPCVD) or any other suitable operations. In some embodiments, the third dielectric layer 110*a* has configuration similar to the one described above or illustrated in FIG. 1, 3 or 5.

Figure 7J:
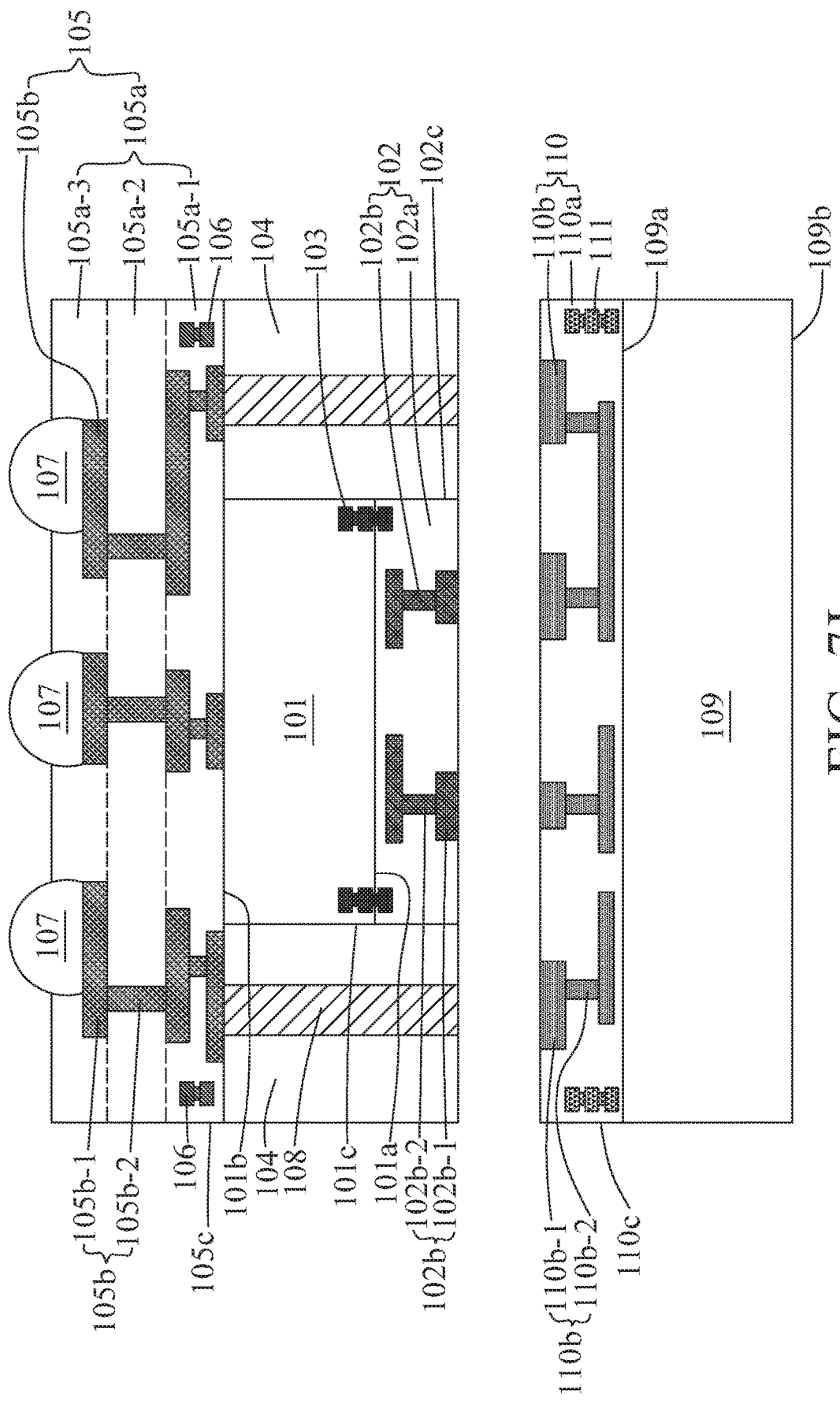

In some embodiments, a third conductive member 110*b* is formed over or within the third dielectric layer 110*a* as shown in FIG. 7J. In some embodiments, the third conductive member 110*b* is extended through at least one layer of the third dielectric layer 110*a*. In some embodiments, the third conductive member 110*b* is formed at a central portion of the third dielectric layer 110*a*. In some embodiments, the third conductive member 110*b* is formed by removing a portion of the third dielectric layer 110*a* to form an opening and then disposing a conductive material into the opening. In some embodiments, the removal of the portion of the third dielectric layer 110*a* includes photolithography, etching or any other suitable operations. In some embodiments, the disposing of the conductive material includes sputtering, electroplating or any other suitable operations. In some embodiments, the conductive material includes copper, silver, gold, aluminum, etc.

In some embodiments, the third conductive member 110*b* includes a third land portion 110*b*-1 and a third via portion 110*b*-2 coupled with the third land portion 110*b*-1. In some embodiments, the third land portion 110*b*-1 and the third via portion 110*b*-2 are stacked over each other. In some embodiments, the third land portion 110*b*-1 and the third via portion 110*b*-2 are stacked alternately. In some embodiments, a third interconnect structure 110 including the third dielectric layer 110*a* and the third conductive member 110*b* is formed over the substrate 109. In some embodiments, the third interconnect structure 110, the second dielectric layer 105*a* and the second conductive member 105*b* third dielectric layer 110*a* and the third conductive member 110*b* have configuration similar to those described above or illustrated in FIG. 1, 3 or 5.

In some embodiments, a third seal ring 111 is formed within the third dielectric layer 110*a*. In some embodiments, the third seal ring 111 is formed adjacent to edge 110*c* of the third dielectric layer 110*a*. In some embodiments, the third seal ring 111 is electrically isolated from the third conductive member 110*b*. In some embodiments, the third seal ring 111 is vertically extended within at least one layer of the third dielectric layer 110*a*.

In some embodiments, the third seal ring 111 is formed by removing a portion of the third dielectric layer 110*a* adjacent to the edge 110*c* of the third dielectric layer 110*a* to form an opening, and then disposing a conductive material into the opening. In some embodiments, the removal of the portion of the third dielectric layer 110*a* includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the third seal ring 111 has configuration similar to those described above or illustrated in FIG. 1, 3 or 5.

Figure 7K:
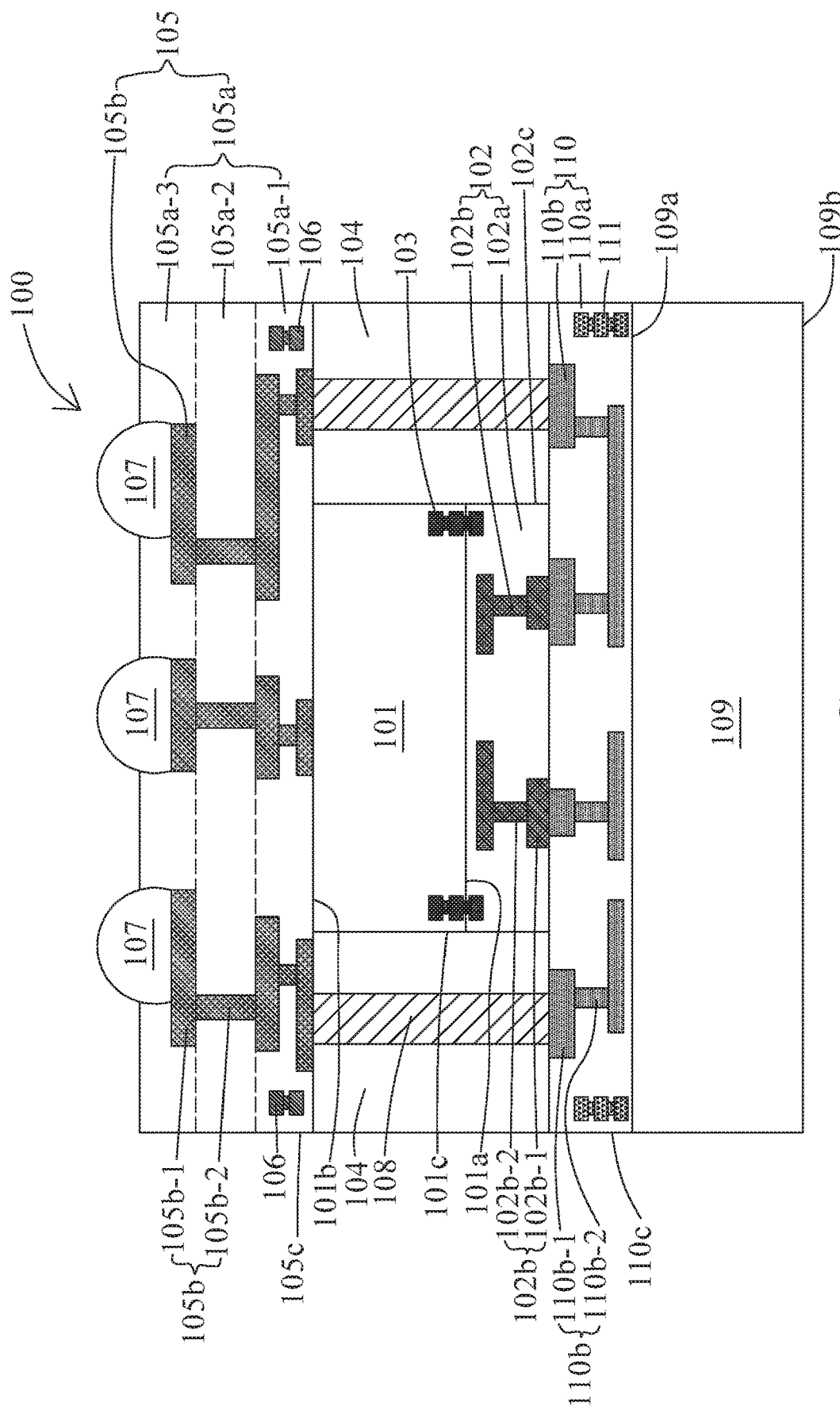

In some embodiments, the first conductive member 102*b* is bonded with the third conductive member 110*b* as shown in FIG. 7K. In some embodiments, the first conductive member 102*b* is vertically aligned with the third conductive member 110*b*. In some embodiments, the first conductive member 102*b* is bonded with the third conductive member 110*b* by eutectic bonding or any other suitable operations. In some embodiments, the first land portion 102*b*-1 is bonded with the third land portion 110*b*-1. In some embodiments, the molding 104 and the first dielectric layer 102*a* are disposed over or bonded with the third dielectric layer 110*a*. In some embodiments, the third conductive member 110*b* is electrically connected to or bonded with the via 108. In some embodiments, the die 101 and the substrate 109 are electrically connected. In some embodiments, the substrate 109 is electrically connected to a circuitry through the third conductive member 110*b*, the via 108, the second conductive member 105*b* and the conductive bump 107. In some embodiments, the semiconductor structure (100, 200, 300) as shown in FIG. 1, 3 or 5 is formed.

In the present disclosure, a semiconductor structure is disclosed. The semiconductor structure includes a die, a molding surrounding the die, an interconnect structure disposed over the die and the molding, and a seal ring disposed within the interconnect structure and adjacent to an edge of the interconnect structure. The seal ring is configured to protect the die, the molding or the interconnect structure from damages caused by cracks, chippings or other contaminants during fabrication or singulation. As such, damages on the semiconductor structure during fabrication or singulation can be minimized or prevented.

In some embodiments, a semiconductor structure is disclosed. The semiconductor structure includes a die, a molding surrounding the die, a first seal ring disposed over the molding, and a second seal ring disposed below the molding. In some embodiments, the semiconductor structure further includes a first dielectric layer disposed over the second surface of the die and over the molding, and a first conductive member disposed in the first dielectric layer. In some embodiments, the first seal ring is disposed in the first dielectric layer and surrounds the first conductive member. In some embodiments, the semiconductor structure further includes a second dielectric layer disposed below the first surface of the die and over the molding, and a second conductive member disposed in the second dielectric layer. In some embodiments, the second seal ring is disposed in the second dielectric layer and surrounds the second conductive member. In some embodiments, a width of the first seal ring is substantially greater than a width of the second seal ring. In some embodiments, the semiconductor structure further includes a third dielectric layer disposed below the first surface of the die and surrounded by the molding, and a third conductive layer disposed in the third dielectric layer. In some embodiments, the third dielectric layer and the third conductive member are disposed between the die and the second dielectric layer, and the third conductive member is electrically connected to the second conductive member.

In some embodiments, a semiconductor structure includes a die including a first surface and a second surface opposite to the first surface; a first interconnect structure disposed below the first surface of the die; a molding surrounding the die and the first interconnect structure; a second interconnect structure disposed over the second surface and the molding; a first seal ring disposed in the second interconnect structure and disposed over the molding; and a second seal ring provided within the die and the first interconnect structure.

In some embodiments, the first interconnect structure further includes a first dielectric layer disposed over the first surface of the die and a first conductive member disposed within the first dielectric layer. In some embodiments, the second seal ring includes a first portion and a second portion, the first portion of the second seal ring vertically extended within the die, and the second portion of the second seal ring vertically extended with in the first dielectric layer of the first interconnect structure. In some embodiments, the first portion of the second seal ring is disposed adjacent to the edge of the die or the molding, and the second portion of the second seal ring is disposed adjacent to the edge of the first dielectric layer or the molding. In some embodiments, the second interconnect structure further includes a second dielectric layer disposed over the second surface of the die and a second conductive member disposed within the second dielectric layer, and the first seal ring is disposed within the second dielectric layer. In some embodiments, the first seal ring is separated from the second conductive member by the second dielectric layer. In some embodiments, the first seal ring is in contact with the second conductive member of the second interconnect structure. In some embodiments, a width of the first seal ring is substantially greater than a width of the second seal ring.

In some embodiments, a semiconductor structure includes a die including a first surface and a second surface opposite to the first surface; a first interconnect structure disposed below the first surface of the die; a molding surrounding the die and the first interconnect structure; a molding surrounding the die and the first interconnect structure; a second interconnect structure disposed over the second surface of the die and the molding; a third interconnect structure disposed below the first interconnect structure and the molding; a first seal ring disposed in the second interconnect structure and disposed over the molding; a second seal ring vertically extended within the die and the first interconnect structure; and a third seal ring disposed in the third interconnect structure and disposed over the molding.

In some embodiments, the first interconnect structure includes a first dielectric layer disposed below the first surface of the die and a first conductive member disposed within the first dielectric layer. In some embodiments, a portion of the second seal ring vertically extended within the die, and another portion of the second seal ring vertically extended within the first dielectric layer of the first interconnect structure. In some embodiments, the second interconnect structure includes a second dielectric layer disposed over the second surface of the die and a second conductive member disposed within the second dielectric layer, and the first seal ring is disposed within the second dielectric layer. The third interconnect structure includes a third dielectric layer below the first surface of the die and a third conductive member disposed within the third dielectric layer, and the third seal ring is disposed within the third dielectric layer. In some embodiments, a width of the first seal ring is substantially greater than a width of the second seal ring. In some embodiments, a width of the first seal ring is substantially greater than a width of the third seal ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a die including a first surface and a second surface opposite to the first surface;
   a molding surrounding the die;
   a first seal ring disposed over the molding; and
   a second seal ring disposed below the molding.

2. The semiconductor structure of claim 1, further comprising:
   a first dielectric layer disposed over the second surface of the die and over the molding; and
   a first conductive member disposed in the first dielectric layer,
   wherein the first seal ring is disposed in the first dielectric layer and surrounds the first conductive member.

3. The semiconductor structure of claim 1, further comprising:
   a second dielectric layer disposed below the first surface of the die and over the molding; and
   a second conductive member disposed in the second dielectric layer,
   wherein the second seal ring is disposed in the second dielectric layer and surrounds the second conductive member.

4. The semiconductor structure of claim 1, wherein a width of the first seal ring is substantially greater than a width of the second seal ring.

5. The semiconductor structure of claim 1, further comprising:
   a third dielectric layer disposed below the first surface of the die and surrounded by the molding; and
   a third conductive member disposed in the third dielectric layer,
   wherein the third dielectric layer and the third conductive member are disposed between the die and the second dielectric layer, and the third conductive member is electrically connected to the second conductive member.

6. A semiconductor structure, comprising:
   a die including a first surface and a second surface opposite to the first surface;
   a first interconnect structure disposed below the first surface of the die;
   a molding surrounding the die and the first interconnect structure;
   a second interconnect structure disposed over the second surface and the molding;
   a first seal ring disposed in the second interconnect structure and disposed over the molding; and
   a second seal ring provided within the die and the first interconnect structure.

7. The semiconductor structure of claim 6, wherein the first interconnect structure further comprises a first dielectric layer disposed below the first surface of the die and a first conductive member disposed within the first dielectric layer.

8. The semiconductor structure of claim 7, wherein the second seal ring comprises a first portion and a second portion, the first portion of the second seal ring vertically extended within the die, and the second portion of the second seal ring vertically extended within the first dielectric layer of the first interconnect structure.

9. The semiconductor structure of claim 8, wherein the first portion of the second seal ring is disposed adjacent to the edge of the die or the molding, and the second portion of the second seal ring is disposed adjacent to the edge of the first dielectric layer or the molding.

10. The semiconductor structure of claim 6, wherein the second interconnect structure further comprises a second dielectric layer disposed over the second surface of the die and a second conductive member disposed within the second dielectric layer, and the first seal ring is disposed within the second dielectric layer.

11. The semiconductor structure of claim 10, wherein the first seal ring is separated from the second conductive member by the second dielectric layer.

12. The semiconductor structure of claim 10, wherein the first seal ring is in contact with the second conductive member of the second interconnect structure.

13. The semiconductor structure of claim 6, wherein a width of the first seal ring is substantially greater than a width of the second seal ring.

14. A semiconductor structure comprising:
   a die including a first surface and a second surface opposite to the first surface;
   a first interconnect structure disposed below the first surface of the die;
   a molding surrounding the die and the first interconnect structure;
   a second interconnect structure disposed over the second surface of the die and the molding;
   a third interconnect structure disposed below the first interconnect structure and molding;
   a first seal ring disposed in the second interconnect structure and disposed over the molding;
   a second seal ring vertically extended within the die and the first interconnect structure; and
   a third seal ring disposed in the third interconnect structure and disposed over the molding.

15. The semiconductor structure of claim 14, the first interconnect structure further comprises a first dielectric layer disposed below the first surface of the die and a first conductive member disposed within the first dielectric layer.

16. The semiconductor structure of claim 15, wherein a portion of the second seal ring vertically extended within the die, and another portion of the second seal ring vertically extended within the first dielectric layer of the first interconnect structure.

17. The semiconductor structure of claim 14, wherein the second interconnect structure further comprises a second dielectric layer disposed over the second surface of the die and a second conductive member disposed within the second dielectric layer, and the first seal ring is disposed within the second dielectric layer.

18. The semiconductor structure of claim 14, wherein the third interconnect structure further comprises a third dielectric layer disposed below the first surface of the die and a third conductive member disposed within the third dielectric layer, and the third seal ring is disposed within the third dielectric layer.

19. The semiconductor structure of claim 14, wherein a width of the first seal ring is substantially greater than a width of the second seal ring.

20. The semiconductor structure of claim 14, wherein a width of the first seal ring is substantially greater than a width of the third seal ring.

* * * * *